(12) United States Patent
Bacri

(10) Patent No.: US 7,834,782 B2
(45) Date of Patent: Nov. 16, 2010

(54) CABAC-TYPE ENCODING DEVICE AND METHOD

(75) Inventor: Stephane Bacri, Paris (FR)

(73) Assignee: Assistance Technique et Etude de Materiels Electroniques-ATEME, Bievres (FR)

(*) Notice: Subject to any disclaimer, the term of this patent is extended or adjusted under 35 U.S.C. 154(b) by 132 days.

(21) Appl. No.: 12/158,697

(22) PCT Filed: Dec. 15, 2006

(86) PCT No.: PCT/FR2006/002756

§ 371 (c)(1),
(2), (4) Date: Oct. 8, 2008

(87) PCT Pub. No.: WO2007/080285

PCT Pub. Date: Jul. 19, 2007

(65) Prior Publication Data

US 2009/0251342 A1    Oct. 8, 2009

(30) Foreign Application Priority Data

Dec. 22, 2005   (FR) .................................. 05 13140

(51) Int. Cl.
*H03M 7/40* (2006.01)
(52) U.S. Cl. ............................. 341/67; 341/50; 341/51; 341/106
(58) Field of Classification Search ................... 341/50, 341/51, 107, 67; 382/239; 375/240.02
See application file for complete search history.

(56) References Cited

U.S. PATENT DOCUMENTS

| 4,891,643 | A | * | 1/1990 | Mitchell et al. ............. 341/107 |
| 4,905,297 | A | * | 2/1990 | Langdon et al. ............. 382/247 |
| 5,233,348 | A | * | 8/1993 | Pollmann et al. ............. 341/67 |
| 2005/0052295 | A1 | | 3/2005 | Bossen |
| 2005/0258982 | A1 | | 11/2005 | Pearson et al. |

FOREIGN PATENT DOCUMENTS

EP        1 189 354 A2    3/2002

OTHER PUBLICATIONS

Wiegand, "Draft Text of Final Draft International Standard for Advanced Video Coding (ITU-T Rec. H264/ISO/IEC 14496-10 AVC)," Parts I-XVI (Mar. 31, 2003).

* cited by examiner

*Primary Examiner*—Jean B Jeanglaude
(74) *Attorney, Agent, or Firm*—Young and Thompson

(57) ABSTRACT

A CABAC-type encoding device for encoding an initial flow of binary digital information for generating an output flow for forming video images after decoding, includes: elements for analyzing successive sequences of bits of the initial binary flow, bit-by-bit, and for deducing, for each bit, an interval representing the occurrence probability associated with the bit, the interval being defined by the size thereof and the lower boundary thereof; elements for analyzing the interval and ensuring a renormalization thereof. The elements for ensuring the renormalization include: a reference table containing, for each possible value of the lower boundary and the size, sequences of bits to be inserted into the output flow, and the number of unknown bits waiting to be inserted for this specific renormalization step; and elements for determining the address of the data, in this reference table.

12 Claims, 4 Drawing Sheets

Figure 1:
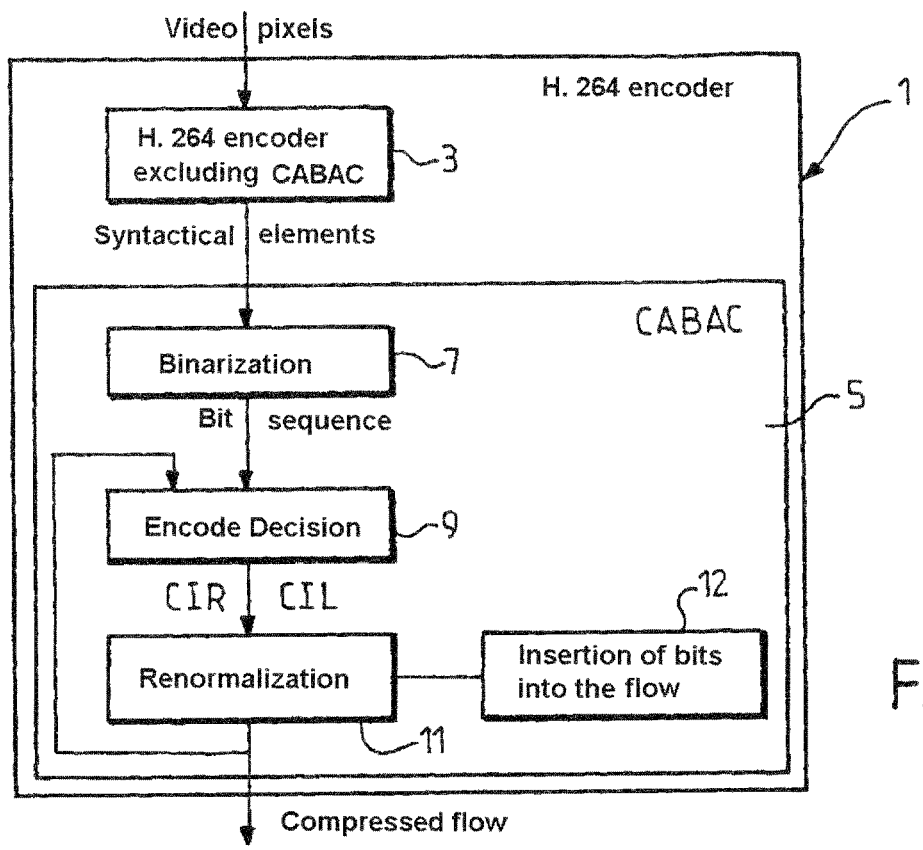

| CIL | iter=1 | iter=2 | iter=3 | iter=4 | BOI | No. of bits | Bits to be inserted |
|---|---|---|---|---|---|---|---|
| 00.000x.xxxx | 0 | 0 | 0 | 0 | 0 | 4 | 0000 |
| 00.001x.xxxx | 0 | 0 | 0 | Ind | 1 | 3 | 000 |
| 00.010x.xxxx | 0 | 0 | Ind | 0 | 0 | 4 | 0001 |
| 00.011x.xxxx | 0 | 0 | Ind | Ind | 2 | 2 | 00 |
| 00.100x.xxxx | 0 | Ind | 0 | 0 | 0 | 4 | 0010 |
| 00.101x.xxxx | 0 | Ind | 0 | Ind | 1 | 3 | 001 |
| 00.110x.xxxx | 0 | Ind | Ind | 0 | 0 | 4 | 0011 |
| 00.111x.xxxx | 0 | Ind | Ind | Ind | 3 | 1 | 0 |
| 01.000x.xxxx | Ind | 0 | 0 | 0 | 0 | 4 | 0100 |
| 01.001x.xxxx | Ind | 0 | 0 | Ind | 1 | 3 | 010 |
| 01.010x.xxxx | Ind | 0 | Ind | 0 | 0 | 4 | 0101 |
| 01.011x.xxxx | Ind | 0 | Ind | Ind | 2 | 2 | 01 |
| 01.100x.xxxx | Ind | Ind | 0 | 0 | 0 | 4 | 0110 |
| 01.101x.xxxx | Ind | Ind | 0 | Ind | 1 | 3 | 011 |
| 01.110x.xxxx | Ind | Ind | Ind | 0 | 0 | 4 | 0111 |
| 01.111x.xxxx | Ind | Ind | Ind | Ind | 4 | 0 | - |
| 10.000x.xxxx | 1 | 0 | 0 | 0 | 0 | 4 | 1000 |
| 10.001x.xxxx | 1 | 0 | 0 | Ind | 1 | 3 | 100 |
| 10.010x.xxxx | 1 | 0 | Ind | 0 | 0 | 4 | 1001 |
| 10.011x.xxxx | 1 | 0 | Ind | Ind | 2 | 2 | 10 |
| 10.100x.xxxx | 1 | Ind | 0 | 0 | 0 | 4 | 1010 |
| 10.101x.xxxx | 1 | Ind | 0 | Ind | 1 | 3 | 101 |
| 10.110x.xxxx | 1 | Ind | Ind | 0 | 0 | 4 | 1011 |
| 10.111x.xxxx | 1 | Ind | Ind | Ind | 3 | 1 | 1 |
| 11.000x.xxxx | 1 | 1 | 0 | 0 | 0 | 4 | 1100 |
| 11.001x.xxxx | 1 | 1 | 0 | Ind | 1 | 3 | 110 |
| 11.010x.xxxx | 1 | 1 | Ind | 0 | 0 | 4 | 1101 |
| 11.011x.xxxx | 1 | 1 | Ind | Ind | 2 | 2 | 11 |
| 11.100x.xxxx | 1 | 1 | 1 | 0 | 0 | 4 | 1110 |
| 11.101x.xxxx | 1 | 1 | 1 | Ind | 1 | 3 | 111 |
| 11.110x.xxxx | 1 | 1 | 1 | 1 | 0 | 4 | 1111 |
| 11.111x.xxxx | 1 | 1 | 1 | 1 | 0 | 4 | 1111 |

FIG.4

CABAC-TYPE ENCODING DEVICE AND METHOD

The application is a National Stage application of PCT/FR2006/002756 filed Dec. 15, 2006, which PCT claims priority to French application No. 05/13140 filed Dec. 22, 2005.

The present invention relates to a method and device of the CABAC (Context-adaptive binary arithmetic coding) type for encoding an initial flow of binary digital information intended for generating an output flow in order to form video images after decoding.

It is known that the syntax and the methods, with which the decoding of a video information flow may be provided, are defined in the video compression standard called ITU H.264 or ISO/IEC 14496 MPEG-4 Part. 10. This standard for information purposes proposes methods with which compressed information flows may be produced.

The encoding devices generating flows complying with this standard include an encoding stage, the task of which is to generate a binary flow which is representative of the information to be transmitted. This encoding stage may resort to two methods called CAVLC (Context-adaptive variable-length coding) and CABAC respectively. This last method is more interesting in that it generates a binary flow with a lower rate than the one produced by the first, however at the expense of larger complexity.

It is known that the CABAC method includes a so-called "renormalization" step. This step resorts to an iterative process which somewhat forms the "bottleneck" of the method, insofar that, by its actual principle, its execution time is relatively long.

The object of the present invention is to propose an encoding method and device in which the iterative process of the prior state of the art is replaced with a process allowing direct access to the same results, and this from the same input parameters.

Thus, the object of the present invention is a device of the CABAC type for encoding an initial flow of binary digital information, intended for generating an output flow in order to form video images after decoding, comprising:
  means capable of analyzing successive sequences of bits of the initial binary flow, bit by bit, and for deducing, for each bit, an interval representing the occurrence probability associated with this bit, the interval being defined by its size and its lower boundary,
  means capable of analyzing this interval and of providing if necessary a renormalization of the latter, characterized in that the means capable of providing this renormalization include:
  a reference table containing, for each possible value of said lower boundary and of said size, sequences of bits to be inserted into the output flow, and the number of unknown bits waiting to be inserted for this specific renormalization step,
  means capable of determining the address in this reference table, of said data and this by concatenation of the initial values of the size of said interval and of its lower boundary in order to notably extract a sequence of bits to be inserted therefrom.

The device according to the invention will also include means capable of providing the insertion into the output flow,
  of the most significant bit of the sequence of said bits to be inserted,
  of the inverse of said most significant bit on the one hand and this for a number of times equal to the value of the number of awaiting bits before renormalization,
  of the other bits of said sequence of bits to be inserted,
  and means capable of resetting to zero, the value of the number of awaiting bits before renormalization on the other hand, provided that the latter have been inserted, and then of adding the value of the number of unknown bits waiting to be inserted to the value of the number of awaiting bits before renormalization.

The reference table will preferably be stored in a memory for which the useful capacity will be of the order of 508 words.

Moreover, the means capable of providing renormalization will be contained in a component of the Application-Specific Integrated Circuit (ASIC) or Field-Programmable Gate Array (FPGA) type.

With the present invention, it is thus possible owing to the very large reduction in the number of required cycles, either to reduce the operating frequency, which provides reduction in the electric consumption of the encoding device while retaining its performances, or to increase the performance of the device, i.e. generating compressed flows at a higher rate, and this without changing the operating frequency.

The object of the present invention is also a method of the CABAC type for encoding an initial flow of binary digital information intended for generating an output flow in order to form video images after decoding, wherein:
  successive series of bits of the initial binary flow are analyzed bit by bit and, for each bit, an interval is deduced, representing the occurrence probability associated with this bit, the interval being defined by its size and its lower boundary,
  this interval is analyzed and, if necessary, renormalization of the latter is provided, characterized in that it includes a single and preliminary step during which a reference table is formed, this method including the phases of:
  establishing for each of the possible values of the lower boundary and the size, the series of the values of the bits to be inserted into the output flow obtained from determination of the values provided by the various successive iterations depending on the size, taking into account that these values may be determinate and will then be equal to 0 or to 1, or indeterminate,
  successively taking each of these values into consideration, and
  if a value is determinate, placing the latter in the sequence of the bits to be inserted,
  if a value is indeterminate, taking at least the next value into consideration until a determinate value or the end of the series is encountered, consequently:
  a) if the end of the series is reached without having a determinate value, incrementing the value of the unknown awaiting bits for this series by a number equal to that of the number of encountered indeterminate values,
  b) otherwise, insert a bit equal to said next value and cause the latter to be followed by as many inverted bits as there are indeterminate values preceding it,
    placing in the table the value of the number of unknown awaiting bits for this series.

According to the invention, renormalization will include the steps of:
  determining the address, in the reference table, of said data by concatenation of the initial value of the sized of said interval and of the initial value of its lower boundary,
  accessing said values and extracting the bits which have to be inserted into the output flow.

Once the bits to be inserted are extracted from the table, their insertion into the output flow will include the steps consisting of:

if there is no bit to be inserted, incrementing the number of awaiting bits before renormalization by a number equal to the number of unknown awaiting bits from the table, if there are bits to be inserted, inserting a) the most significant bit of the sequence of said bits to be inserted, followed b) by the inverse of this most significant bit, and this a number of times equal to the value of the number of awaiting bits before renormalization, followed c) by the other bits to be inserted, d) replacing the number of awaiting bits before renormalization by the number of unknown awaiting bits read in the table.

Figure 2:
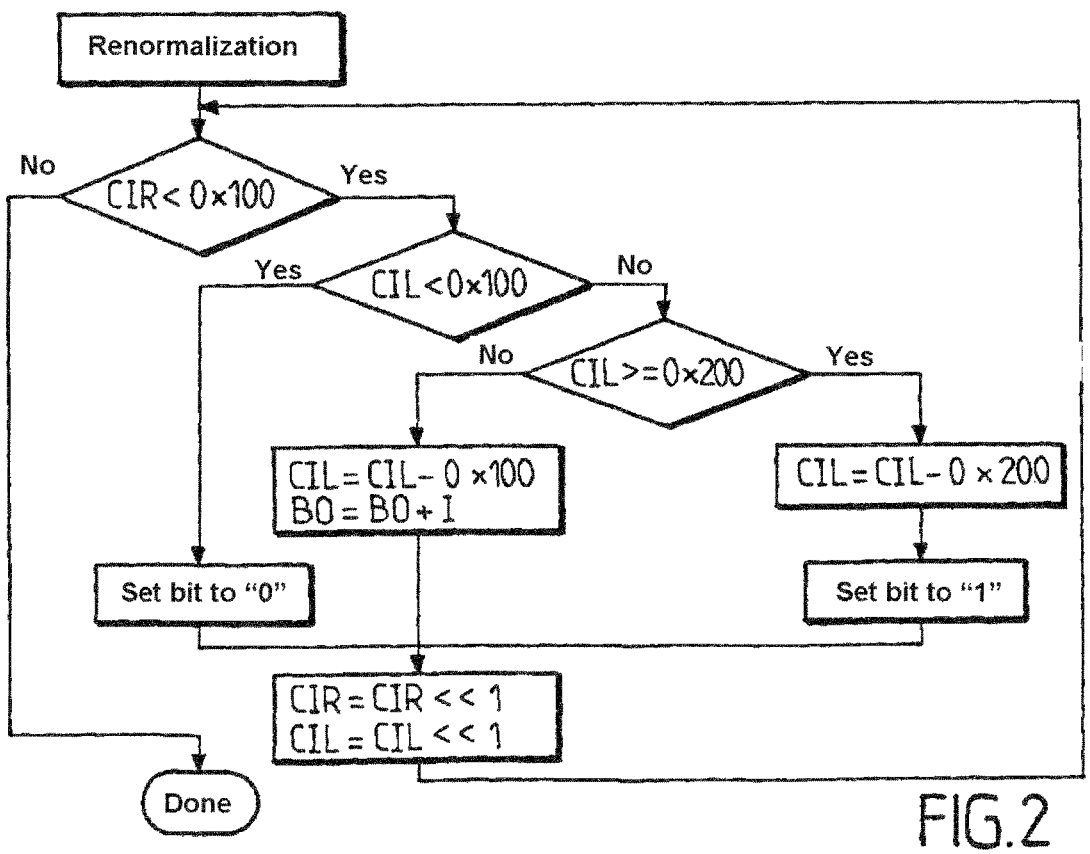
Figure 3:
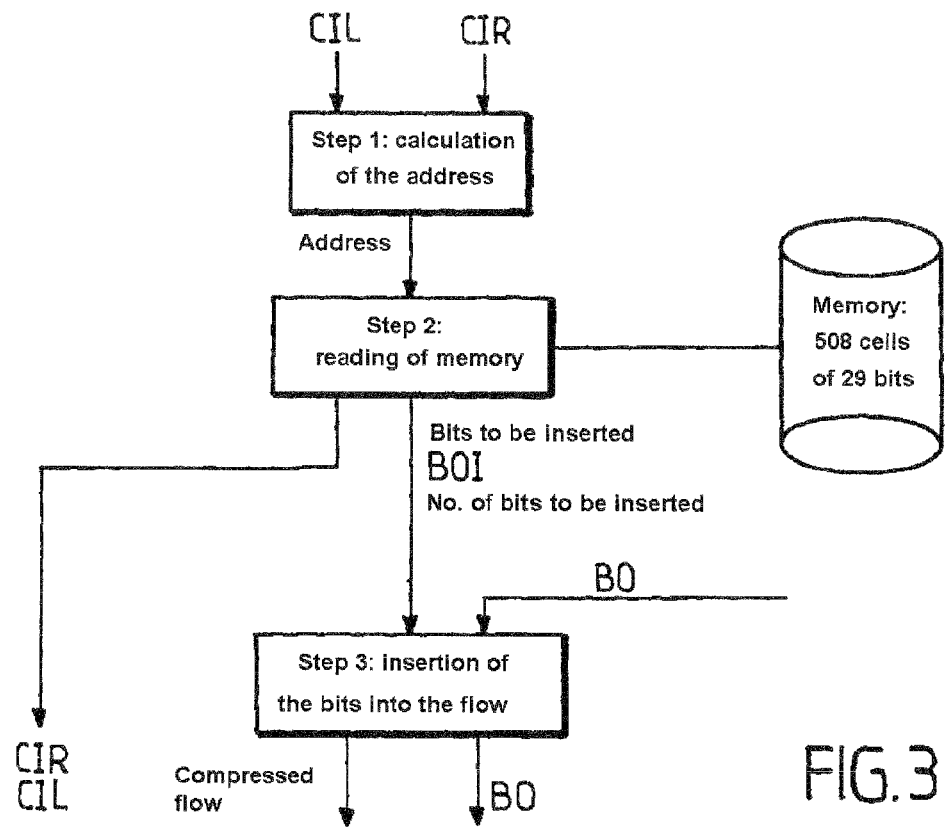
Figure 5:
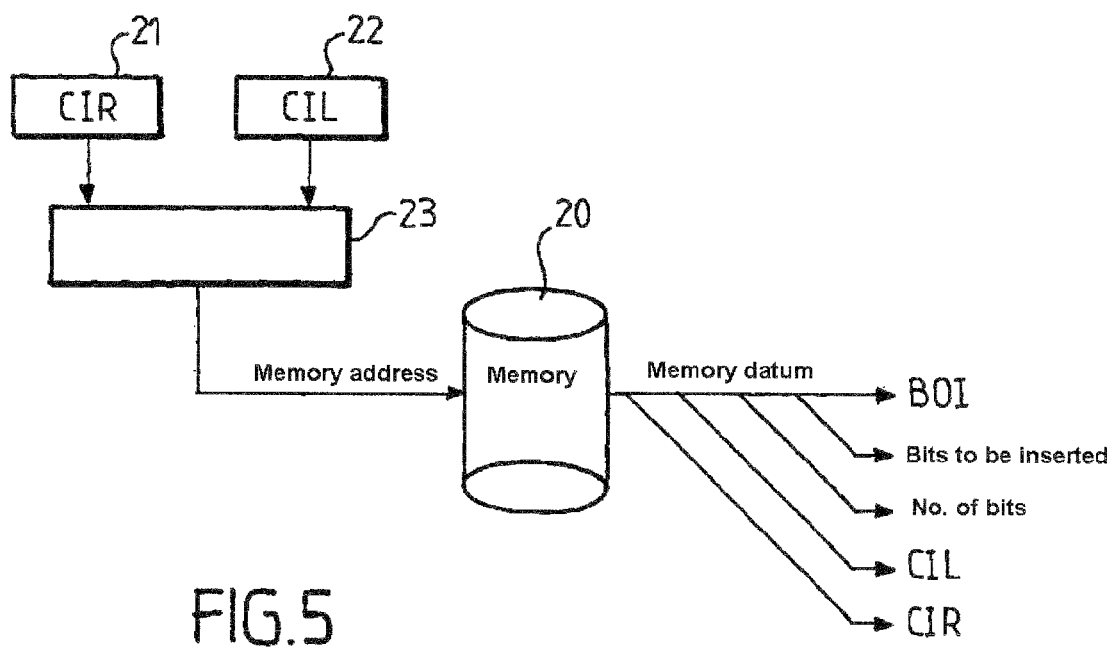
Figure 6:
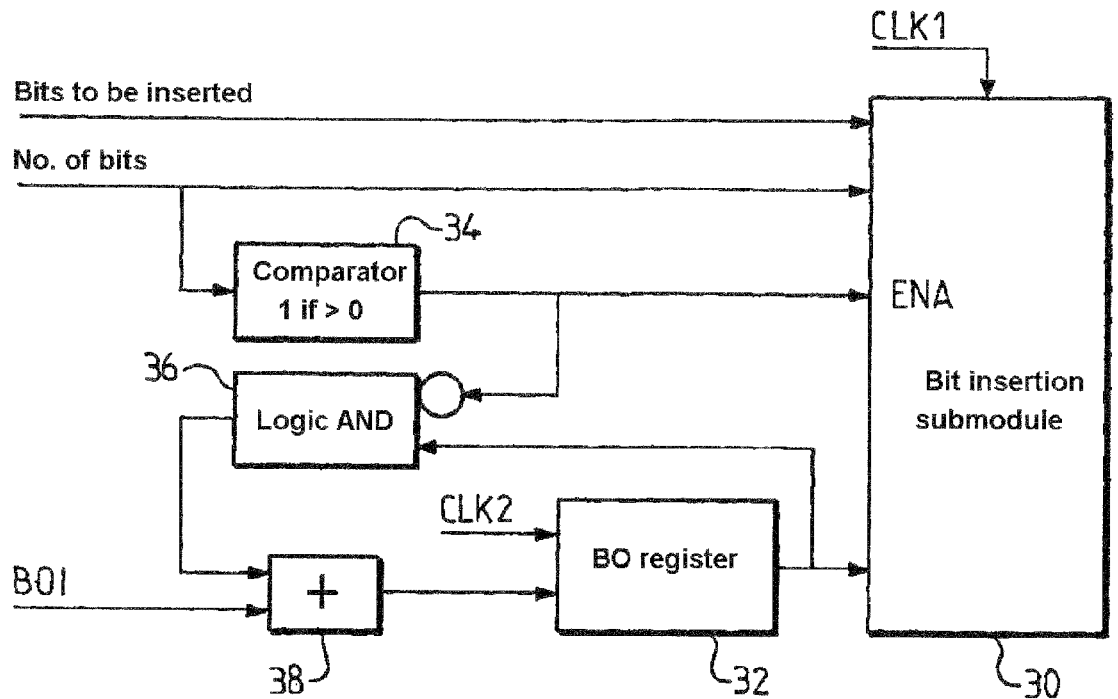
Figure 7:
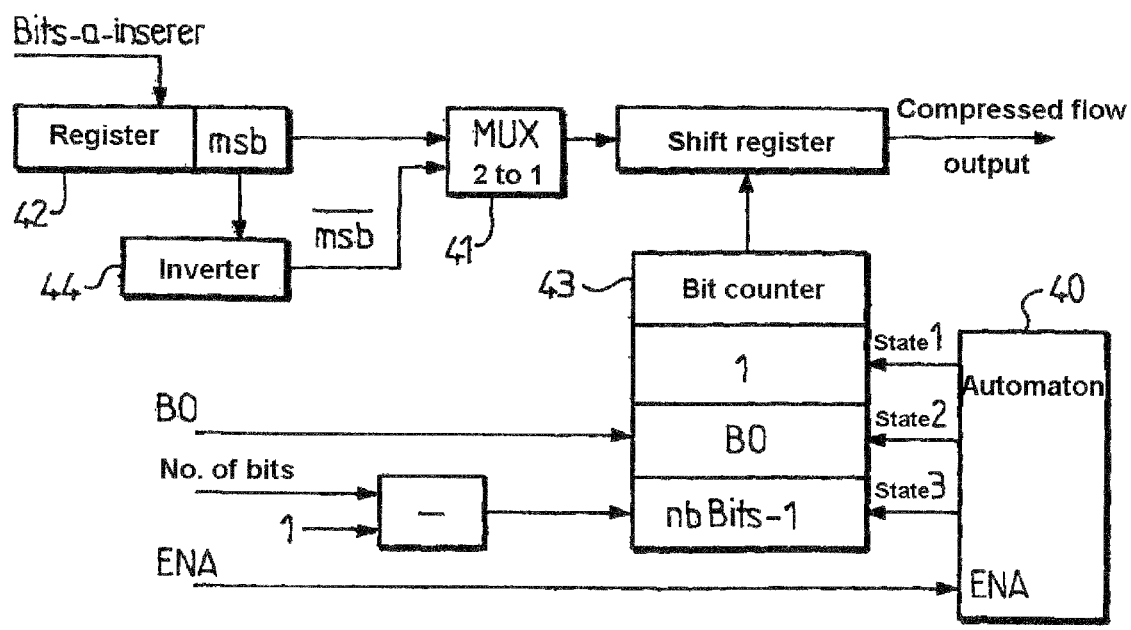

An embodiment of the present invention will be described as a non-limiting example, hereafter with reference to the appended drawing wherein:

FIG. 1 is a schematic illustration of an encoder compliant with the H.264 standard showing the different modules, with which the steps for applying the CABAC method may be performed, FIG. 2 is a schematic representation of the different steps of the renormalization phase according to the prior state of the art, FIG. 3 is a schematic illustration of the different steps of the renormalization phase according to the invention, FIG. 4 is an illustration of the reference table used in the device and the method according to the invention, FIGS. 5 and 6 schematically illustrate two examples of electronic devices with which the reading and bit insertion steps according to the present invention may be applied respectively, FIG. 7 is a schematic view of a detail of the application of FIG. 6, i.e. a submodule for inserting bits.

As illustrated in FIG. 1, the encoder 1 compliant with the H.264 standard, comprises encoding means 3, which, upon receiving the video pixels, provide at the output, data, called syntax elements, which are sent to encoding means compliant with the CABAC method. For the sake of simplification, these means 5 will be designated as "the CABAC" hereafter.

The CABAC 5 thus has binarization means 7 which transform the syntax elements into bit sequences, which are followed by means 9 designated as "EncodeDecision" in the H.264 standard and which analyze these sequences of bits, bit by bit, in order to deduce an interval therefrom which is representative of the occurrence probability associated with the relevant bit. This interval is characterized by two parameters, i.e. its size designated as "CodIRange" in said standard on the one hand and which is designated as CIR hereafter, and its lower boundary designated as "CodILow" in said standard on the other hand and which is designated by CIL hereafter.

These EncodeDecision means 9 are in relationship with means 11 which apply the renormalization function mentioned earlier. This function provides the analysis of each of said intervals associated with each of the bits of said bit sequence and decides whether the latter should be rescaled, in other words renormalized, or not. When it is found that renormalization is unnecessary, this step is short-circuited.

The renormalization means 11 are followed by insertion means 12, the role of which is to insert one or more bits into the compressed flow.

As a reminder, the different steps of the renormalization phase 11 according to the prior state of the art are illustrated in FIG. 2, i.e. of the one in which an iterative process is required.

In a first step of this phase, the value of CIR is tested in 13 in order to find out whether its size is less than ¼ or not. If this is not the case, there is no renormalization and this step is short-circuited for the relevant bit.

If the value of CIR is less than ¼, there should be resealing, in other words renormalization, and this value is then successively multiplied by 2 as long as it remains less than ¼. These are the successive iterations which represent significant execution time.

The present invention proposes to replace the whole iterative process by direct access to a reference table which may be stored in memory and which provides the different values of various required parameters, and notably a) the sequence of bits to be inserted into the flow, b) the number of bits BOI, the value of which cannot be determined and which are waiting to be inserted for this renormalization. Once these values are determined, one still has to proceed with inserting the bits into the output flow.

One next proceeds with processing the next bit extracted from the initial flow.

Accordingly, the method for applying the present invention includes a preliminary step during which a reference table T1 is built once and for all, which is for example stored in a memory, or which is wired in a logic decoder. It is then this reference table T1 which will be looked up during the application of the renormalization in order to directly extract from it the values obtained earlier by iteration.

The actual renormalization thus includes three essential steps, i.e.: a first step in which the address where the data are stored in the reference table is determined, and this from the parameters CIL and CIR, a second step for consulting this table at said address, from which the values mentioned earlier are extracted, and a third step in which the bits to be inserted are inserted into the output flow, and where the number of bits to be inserted as well as the values of CIL and CIR are updated while waiting for the next renormalisation.

I—Preliminary Step: Forming the Reference Table

As an example, the formation of the reference table T1 intended to be implanted in a memory, is described hereafter, for all the values of CIL and for a number of iterations of 4 which corresponds to a CIR value of 00001XXXX. In order to obtain the full contents of the table, in other words for iterations from 1 to 7, one will proceed in the same way as discussed above.

In FIG. 4, an example of this reference table T1 is illustrated. In column 1 of the latter, are placed the different possible values capable of being assumed by CIL and in columns 2-5, the values "0" or "1" obtained when the iterations performed according to the prior state of the art respectively lead to the insertion of a 0 or a 1, or to the indication "ind" when this value is indeterminate, the iteration not being able to lead to a decision of insertion, insofar that the latter depends on the value of the next bit. In such a situation, BOI is incremented. The values of this variable were transferred into the 6$^{th}$ column of the reference table T1.

The number of bits to be inserted was transferred into the 7$^{th}$ column of the reference table T1, and the sequence of the bits to be inserted was transferred into the 8$^{th}$ column.

In order to establish said table, a means may for example consist of taking each of the successive values of the 4 columns $iter_1$; $iter_2$; $iter_3$; $iter_4$ into consideration. If the relevant value is determinate, this value is placed into the series of the bits to be inserted.

EXAMPLE 1

Let there be a series of four successive values $iter_n$: 1; 1; 1; 0 (Table T1 line 29)

Bits to be inserted: 1 1 1 0

Incrementation of the BOI value: 0

If these values do not contain any indeterminate bit, they will form the values of the bits to be inserted, and the value of BOI will be equal to 0.

EXAMPLE 2

Let there be a series of four successive values $iter_n$: ind; ind; 0; 0 (Table T1 line 30)

Bits to be inserted: 0 1 1 0

Incrementation of the BOI value: 0

If the relevant value is indeterminate, the next value will then be examined until one either reaches a determinate value or the end of the series (n=4 here).

Under these conditions, if one finds a determinate value before encountering the end of the series, a bit equal to this determinate value is inserted in the series of the bits to be inserted and the latter is followed by as many inverted bits (relatively to this determinate value) as there are indeterminate values which precede it.

EXAMPLE 3

Let there be a series of four successive values $iter_n$: 0; 0, ind; ind; (Table T1 line 4)

Bits to be inserted: 0 0

Incrementation of the BOI value: 2

If the relevant value is indeterminate and if the end of the series is reached before encountering a determinate value, it is impossible to know the value of the bits to be inserted. Under these conditions, the value of the determinate bits encountered before the relevant indeterminate bit is assumed and the number of awaiting bits (BOI) is incremented by a number equal to that of the number of encountered indeterminate values.

EXAMPLE 3'

Special Case of Example 3

Let there be a series of four successive values $iter_n$: ind; ind; ind; ind (Table T1 line 16)

Bits to be inserted: none

Incrementation of the BOI value: 4

As the four values are indeterminate, there is therefore no bit to be inserted and the value of BOI is set to 4.

The bits to be inserted, the value of BOI and the number of bits to be inserted are thus transferred into Table T1.

II—First Step: Determination of the Address

The address is obtained by concatenation of the CIR and CIL values. As CIR is given with 9 bits and CIL with 10 bits, the address should therefore require 19 bits. However, it is seen that in the prior state of the art, each iteration of the renormalization function is exclusively based on the analysis of the most significant bit of the CIR and that at each iteration the CIR is multiplied by 2, which amounts to shifting one bit to the left. The number of iterations n which would have been required in the method according to the prior state of the art, may therefore be calculated by determining the position of the most significant bit of the CIR. Further, knowing that, according to the H.264 standard, the value of CIR is larger than or equal to 2 before resorting to renormalization, its 2 least significant bits are not used. By denoting the 9 CIR bits as c[8.0], only the bits c[7.2] are utilized for determining the number of iterations. The truth table is given in Table 1 hereafter.

At each iteration, only the two most significant bits of CIL are used. During the whole step of renormalization, only the n+1 most significant CIL bits (n being the number of iterations) are therefore utilized (2 bits for a single iteration, i.e. 4 values in the memory, 3 bits for 2 iterations, i.e. 8 values in the memory, etc. . . .

TABLE I

| CIR bits | | | | | | Value |
|---|---|---|---|---|---|---|
| 7 | 6 | 5 | 4 | 3 | 2 | of n |
| 1 | X | x | x | x | x | 1 |
| 0 | 1 | X | X | X | X | 2 |
| 0 | 0 | 1 | X | X | X | 3 |
| 0 | 0 | 0 | 1 | x | X | 4 |
| 0 | 0 | 0 | 0 | 1 | X | 5 |
| 0 | 0 | 0 | 0 | 0 | 1 | 6 |
| 0 | 0 | 0 | 0 | 0 | 0 | 7 |

Knowing that there may be at most 7 iterations, the number of memory cells required for determining the address is therefore: 4+8+16+32+64+128+256=508 words. Therefore, the normally required memory capacity is thereby reduced in a particularly rational way.

This reduction in the required memory capacity is particularly of interest insofar that it is known that in such devices, the internal memory capacity of the components is always a critical resource, since it influences not only the cost of the components but also their power consumption.

III—Second Step: Reading the Reference Table T1

The values of CIR and CIL directly lead to the values of the required parameters, i.e. to the bits to be inserted, to the value of BOI, to the number of bits to be inserted, to the new value of CIR and to the new value of CIL.

IV—Third Step: Insertion of the Bits to be Inserted

This step will occur in two phases. In a first phase, the bits to be inserted will be inserted by involving the value of the number BO of awaiting bits, which remains from the previous renormalization(s).

During this first phase, the bits to be inserted given by the reference table T1 generated during the preliminary step will be taken into consideration. After the first bit, or the most significant bit, a number of inverse bits of the latter equal to the number of awaiting bits from the previous renormalization(s), i.e. BO, will be inserted. The value of BOI will then be transferred into BO.

If there is no bit to be inserted, BO will be incremented with the BOI value.

Table II hereafter gives a few examples as an indication:

TABLE II

| | Bits to be inserted (from T1) | BO | BOI (from T1) | Bits inserted | BO after renormalization |
|---|---|---|---|---|---|
| Ex. 1 | 0 1 0 1 | 3 | 0 | 0111101 | 0 |
| Ex. 2 | 1 0 1 | 0 | 1 | 1 0 1 | 1 |
| Ex. 3 | None | 1 | 4 | None | 5 |
| Ex. 4 | 0 | 2 | 3 | 0 1 1 | 3 |

Means of an electronic type will be described hereafter, with reference to FIGS. 5 and 6, with which the reading (step 2) and bit sequence insertion (step 3) steps may be applied respectively.

In FIG. 5, the reference table T1 is contained in a RAM memory 20 formed with 508 cells of 29 bits. The CIR and CIL values are respectively contained in registers 21 and 22 and these values are transferred to a computation register 23 in which concatenation of the latter is carried out as discussed earlier. The address of the memory 20 containing the sought parameters is thereby obtained directly.

An example of electronic means capable of carrying out the step for inserting the bits into the output flow is illustrated in FIG. 6. This device essentially consists of a bit insertion submodule 30 controlled by the clock signal CLK1, of a register 32 in which the number BO of awaiting bits from the preceding renormalization(s) is stored and which is controlled by a clock signal CLK2, of a comparator 34, of a set of logic AND gates 36 and an adder 38.

The insertion module 30 receives from Table T1, not shown in the drawing, the bits to be inserted as well as the number of bits to be inserted (nbBits). It this number is greater than 0, the insertion module 30 is enabled by its enable command ENA and the value BO read in the register 32 is set to 0 by means of the set of logic gates 36. This BO value is then reset with the value BOI read in table T1. The adder 38 receives from the table T1 the value BOI of the unknown bits waiting to be inserted. When the value of the comparator 34 is not greater than 0 (no bits to be inserted), the value BO is only replaced with the sum of BO and BOI by means of the adder 38. The insertion module 30 is enabled on the clock CLK1 which precedes the clock CLK2 so that the register BO may be utilized by this module before being updated.

An example of a bit insertion submodule which operates in a serial mode is illustrated in FIG. 7. This submodule is based on an automaton 40 with 3 states:

In state 1 of the automaton 40, a multiplexer 41 has its input directed onto a register 42 containing the bits to be inserted which are provided to it by the Table T1 and 1 bit (value of a bit counter 43=1) is generated. This bit is the most significant bit (msb) of the register 42 and forms the $1^{st}$ bit to be inserted.

In state 2, of the automaton 40, the multiplexer 41 has its input directed on the inverse of msb, which is provided to it by an inverter 44 and BO bits are generated (value of the bit counter 300=BO), the value of which is thus the inverse of the bit generated earlier. If BO is zero, no bits are generated.

In state 3 of the automaton 40, the multiplexer has its input directed onto the register 42 and the remainder of the bits to be inserted into the flow, if there are any, (value of the bit counter 300=(nbBits−1) with nbBits greater than 1) is generated.

The present invention may also be applied in software by resorting to a signal processing processor or any other processor.

A software processing example is illustrated by the appended pseudo-code.

Annex

```
/* computation of the memory address on 14 bits (excluding
   concatenation on 9 bits) */
adresseMemoire = ((CIR & OxFC) << 8) + (CIL >> 2);
/* reading the memory: data on 32 bits */
donneeMemoire = Memoire [adresseMemoire];
/* extraction of the useful data */
Bits-a-Inserer = (donneeMemoire & Ox7F);
BOI = ((donneeMemoire & 0X380) >> 7);
nbBits = ((donneeMemoire & 0x1C00) >> 10) ;
/* Note: for CIR, the least significant bit should be forced
   to 0 */
CIR = ((donneeMemoire & 0xFE000) >> 12);
/* Note: for CIL, the least significant bit should be forced
   to 0 */
CIL = ((donneeMemoire & 0x1FF00000) >> 19);
/* All the useful data have been extracted from the memory,
   insertion of bits may be performed */
if (nbBits != 0) then
    msb = (Bits-a-Inserer >> nbBits);
    insertBit (msb, 1);
    if (BO != 0) then
    insertBit (!msb, BO);
    end if
    BO = 0
    if (nbBit > 1) then
    insertBit (Bits-a-Inserer, (nbBits-1));
end if
BO = BO + BOI;
```

The subfunction for inserting bits, insertBit (bits, number), depends on the internal architecture of the processor. If this is a 32-bit processor, this may be an iterative function which inserts 32 bits at each cycle into the output flow.

The invention claimed is:

1. A device of the CABAC type for encoding an initial flow of binary digital information intended for generating an output flow in order to form video images after decoding, comprising:

means capable of analyzing successive sequences of bits of the initial binary flow and of deducing for each bit, an interval representing the occurrence probability associated with this bit, the interval being defined by its size (CIR) and its lower boundary (CIL), means capable of analyzing this interval and of providing, if necessary, renormalization of the latter, characterized in that the means capable of providing this renormalization include:

a reference table (T1) containing, for each possible value of said lower boundary (CIL) and of said size (CIR), sequences of bits to be inserted into the output flow, and the number (BOI) of unknown bits which are waiting to be inserted for this specific renormalization step, means capable of determining the address in this reference table (T1), of said data and this by concatenation of the initial values of the size (CIR) of said interval and of its lower boundary (CIL) in order to notably extract therefrom a sequence of bits to be inserted.

2. The device according to claim 1, characterized in that it includes means capable of providing the insertion into the output flow, of the most significant bit of the sequence of said bits to be inserted, of the inverse of said most significant bit, and this for a number of times equal to the value (BO) of the number of awaiting bits before renormalization, of the other bits of said sequence of bits to be inserted, on the one hand, and means capable of resetting to zero, the value (BO) of the number of awaiting bits before renormalization, on the other hand, provided that the latter have been inserted, and then adding the value (BOI) of the number of unknown bits waiting to be inserted to the value (BO) of the number of awaiting bits before renormalization.

3. The device according to claim 1, characterized in that said reference table (T1) is stored in a memory.

4. The device according to claim 3, characterized in that the useful capacity of the memory is of the order of 508 words.

5. The device according to claim 1, characterized in that the renormalization means are contained in a component of the application-specific integrated circuit (ASIC) or field-programmable gate array (FPGA) type.

6. A method of the CABAC type for encoding an initial flow of binary digital information intended for generating an output flow in order to form video images after decoding, wherein:

successive series of bits of the initial binary flow are analyzed bit by bit and, for each bit, an interval is deduced therefrom, representing the occurrence probability associated with this bit, defined by its size (CIR) and its lower boundary (CIL), this interval is analyzed and if necessary renormalization of the latter is provided, characterized in that it includes a single and preliminary step during which a reference table (T1) is formed, this method including the phases of:

establishing, for each of the possible values of the lower boundary (CIL) and of the size (CIR), the series of the values of the bits to be inserted into the output flow obtained from a determination of the values provided by the various successive iterations depending on the size (CIR), taking into account that these values may be determinate and will then be equal to 0 or to 1, or indeterminate, successively taking each of these values into consideration, and if a value is determinate, placing the latter in the sequence of the bits to be inserted, if a value is indeterminate, taking at least the next value into consideration until a determinate value or the end of the series is reached, consequently:

a) if the end of the series is reached before having a determinate value, incrementing the value (BOI) of the unknown awaiting bits for this series by a number equal to that of the number of encountered indeterminate values, b) otherwise, inserting a bit equal to said next value and cause the latter to be followed by as many inverted bits as there are indeterminate values preceding it, placing in the table (T1), the value (BOI) of the number of unknown awaiting bits for this series.

7. The encoding method according to claim 6, characterized in that renormalization includes the steps of:

determining the address in the reference table (T1) of said data by concatenation of the initial value of the size (CIR) of said interval and of the initial value (CIL) of its lower boundary, accessing said values and extracting the bits which have to be inserted into the output flow.

8. The encoding method according to claim 7, characterized in that the insertion of the bits into the output flow includes the steps of:

if there is no bit to be inserted, incrementing the number (BO) of awaiting bits before renormalization by a number equal to the number (BOI) of unknown awaiting bits from the table (T1), if there are bits to be inserted, inserting a) the most significant bit of the sequence of said bits to be inserted, followed b) by the inverse of this most significant bit, and this a number of times equal to the value (BO) of the number of awaiting bits before renormalization, followed c) by the other bits to the inserted, d) replacing the number of awaiting bits (BO) before renormalization with the number of unknown awaiting bits (BOI) read in the table (T1).

9. The device according to claim 2, characterized in that said reference table (T1) is stored in a memory.

10. The device according to claim 2, characterized in that the renormalization means are contained in a component of the application-specific integrated circuit (ASIC) or field-programmable gate array (FPGA) type.

11. The device according to claim 3, characterized in that the renormalization means are contained in a component of the application-specific integrated circuit (ASIC) or field-programmable gate array (FPGA) type.

12. The device according to claim 4, characterized in that the renormalization means are contained in a component of the application-specific integrated circuit (ASIC) or field-programmable gate array (FPGA) type.

* * * * *